(12) United States Patent
Matsuura et al.

(10) Patent No.: US 10,199,498 B2
(45) Date of Patent: Feb. 5, 2019

(54) SEMICONDUCTOR MEMORY DEVICE

(71) Applicant: TOSHIBA MEMORY CORPORATION, Minato-ku (JP)

(72) Inventors: Osamu Matsuura, Kuwana (JP); Hideki Inokuma, Yokkaichi (JP); Masanari Fujita, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 12 days.

(21) Appl. No.: 15/262,433

(22) Filed: Sep. 12, 2016

(65) Prior Publication Data

US 2017/0229577 A1    Aug. 10, 2017

Related U.S. Application Data

(60) Provisional application No. 62/293,357, filed on Feb. 10, 2016.

(51) Int. Cl.
*H01L 29/78*    (2006.01)
*H01L 27/1157*    (2017.01)
*H01L 27/11582*    (2017.01)

(52) U.S. Cl.
CPC ...... *H01L 29/7843* (2013.01); *H01L 27/1157* (2013.01); *H01L 27/11582* (2013.01)

(58) Field of Classification Search
CPC ........... H01L 29/7843; H01L 27/11582; H01L 27/1157; H01L 29/792; H01L 27/11563; H01L 29/4234; H01L 29/66833
USPC ................................................ 257/326, 324
See application file for complete search history.

(56) References Cited

U.S. PATENT DOCUMENTS

| | | | |
|---|---|---|---|
| 8,309,405 B2 | 11/2012 | Yang et al. | |
| 8,933,491 B2 | 1/2015 | Liu | |
| 2012/0083077 A1* | 4/2012 | Yang | H01L 27/11582 438/156 |
| 2015/0035036 A1 | 2/2015 | Konno et al. | |
| 2015/0206900 A1* | 7/2015 | Nam | H01L 27/11582 257/326 |

FOREIGN PATENT DOCUMENTS

JP    2015-28982    2/2015

* cited by examiner

*Primary Examiner* — Moazzam Hossain
*Assistant Examiner* — Stanetta D Isaac
(74) *Attorney, Agent, or Firm* — Oblon, McClelland, Maier & Neustadt, L.L.P.

(57) ABSTRACT

According to one embodiment, a semiconductor memory device includes a substrate, a stacked body, a pillar structure, at least one charge storage film, and a first electrode. The stacked body includes electrode films stacked separately from each other. The pillar structure is provided in the stacked body and includes a semiconductor layer extending in stacking direction of the stacked body. The charge storage film is provided between the semiconductor layer and the electrode films. The first electrode is provided in the stacked body, spreads in the stacking direction and a first direction along a surface of the substrate, and contacting the substrate. The first electrode includes a first portion containing a material having conductivity and a second portion containing a material that a linear expansion coefficient is lower than a linear expansion coefficient of silicon, and positioned at a substrate side than the first portion in the stacking direction.

18 Claims, 16 Drawing Sheets

US 10,199,498 B2

SEMICONDUCTOR MEMORY DEVICE

CROSS-REFERENCE TO RELATED APPLICATIONS

This application is based upon and claims the benefit of priority from U.S. Provisional Patent Application 62/293,357, filed on Feb. 10, 2016; the entire contents of which are incorporated herein by reference.

FIELD

Embodiments described herein relate generally to a semiconductor memory device.

BACKGROUND

A memory device having a three-dimensional structure has been proposed, in which memory holes are formed in a stacked body including a plurality of electrode films stacked with an insulating film therebetween, and a silicon body serving as a channel is provided on a side wall of the memory hole with a charge storage film between the side wall and the silicon body. The electrode film functions as a control gate in a memory cell and is formed of a conductive material. In case where the electrode film is formed of metal, a stress such as a compressive stress or a tensile stress occurs in the electrode film. As the electrode film is formed longer in one direction, it is feared that the warp of a wafer becomes large by such a stress.

BRIEF DESCRIPTION OF THE DRAWINGS

FIG. 4A and FIG. 4B to FIG. 11A and FIG. 11B are diagrams showing a method for manufacturing the semiconductor memory device according to the first embodiment;

FIG. 14A and FIG. 14B to FIG. 16A and FIG. 16B are diagrams showing a method for manufacturing the semiconductor memory device according to the second embodiment.

DETAILED DESCRIPTION

Figure 1:
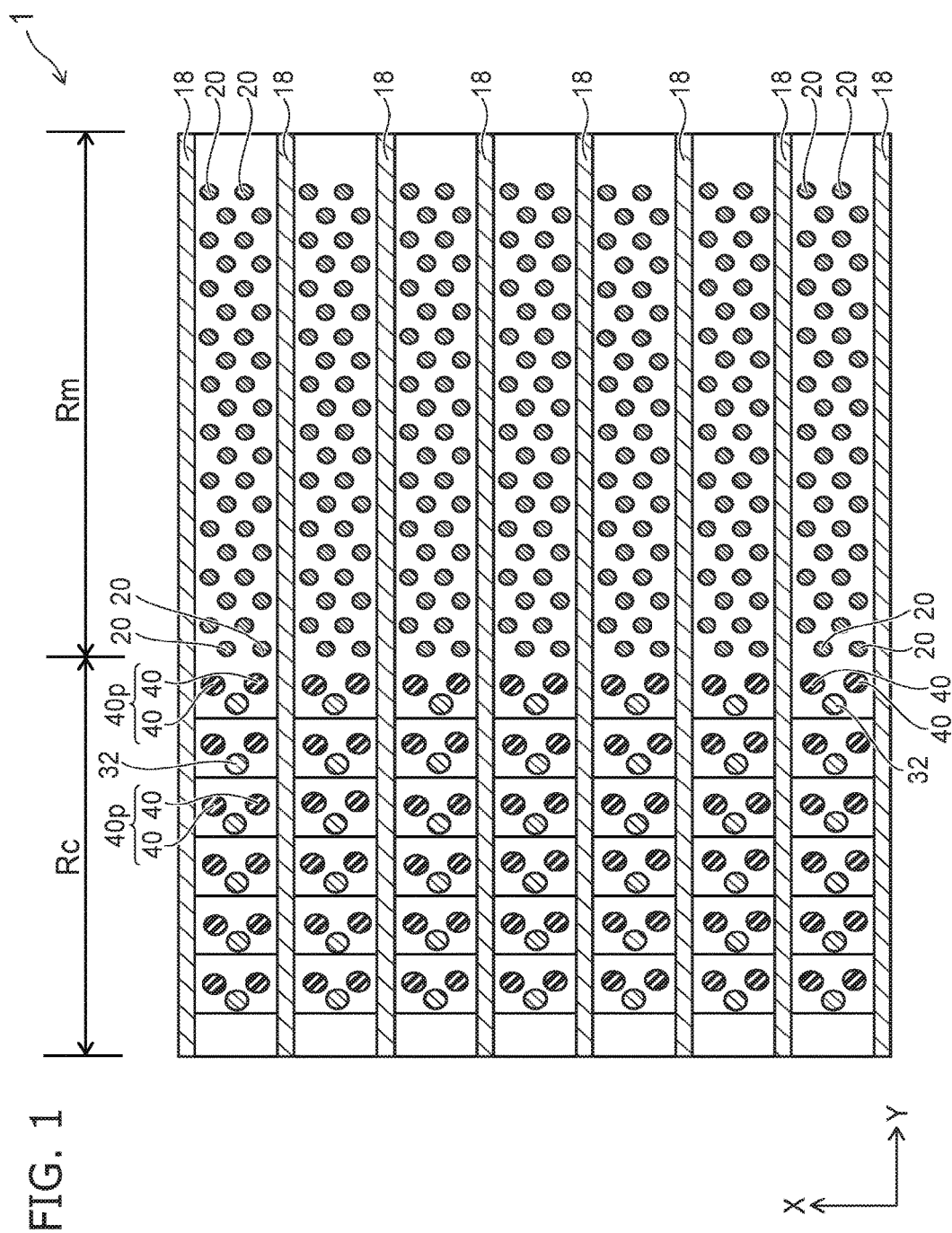
FIG. 1 is a schematic plan view showing a semiconductor memory device according to a first embodiment.

According to one embodiment, a semiconductor memory device includes a substrate, a stacked body, a pillar structure, at least one charge storage film, and a first electrode. The stacked body is provided on the substrate. The stacked body includes a plurality of electrode films stacked separately from each other. The pillar structure is provided in the stacked body and includes a semiconductor layer extending in a stacking direction of the stacked body. The charge storage film is provided between the semiconductor layer and the electrode films. The first electrode is provided in the stacked body and spreads in the stacking direction and a first direction along a surface of the substrate, the first electrode contacting the substrate. The first electrode includes first and second portions, the first portion containing a material having conductivity, the second portion containing a material that a linear expansion coefficient is lower than a linear expansion coefficient of silicon, the second portion being positioned at a substrate side than the first portion in the stacking direction.

Various embodiments will be described hereinafter with reference to the accompanying drawings. In the respective drawings, the same elements are labeled with like reference numerals. All of drawings shown in the following are schematic. For example, for convenience to see the drawings, in some drawings, some constituent features are omitted or the number of the constituent features is reduced for drawing. The number and dimension ratio of the respective constituent features are not always consistent among drawings.

(First Embodiment)

FIG. 1 is a schematic plan view showing a semiconductor memory device according to a first embodiment.

Figure 2:
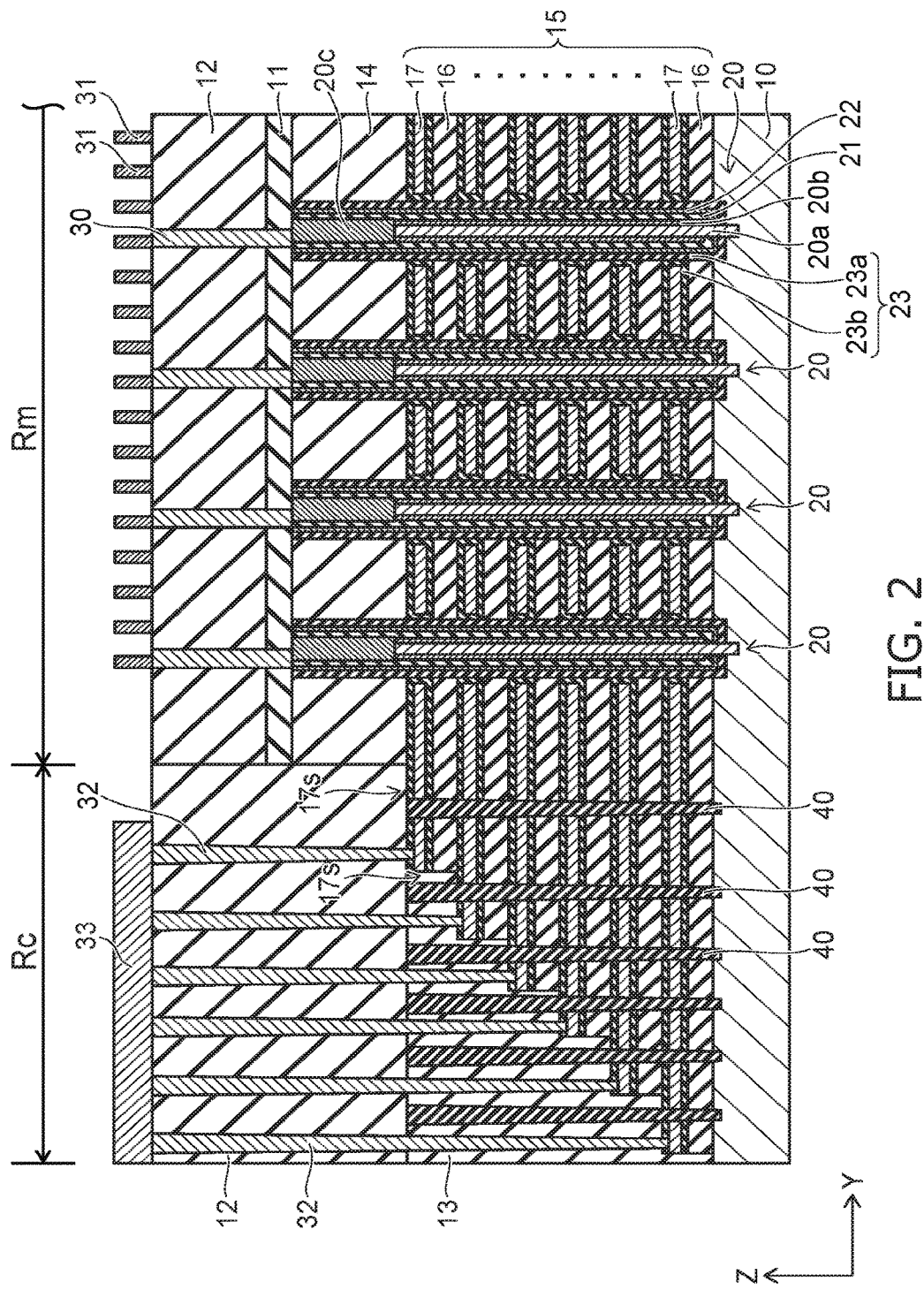
FIG. 2 is a schematic sectional view showing the semiconductor memory device according to the first embodiment.

FIG. 2 is a schematic sectional view showing the semiconductor memory device according to the first embodiment.

Figure 3A:
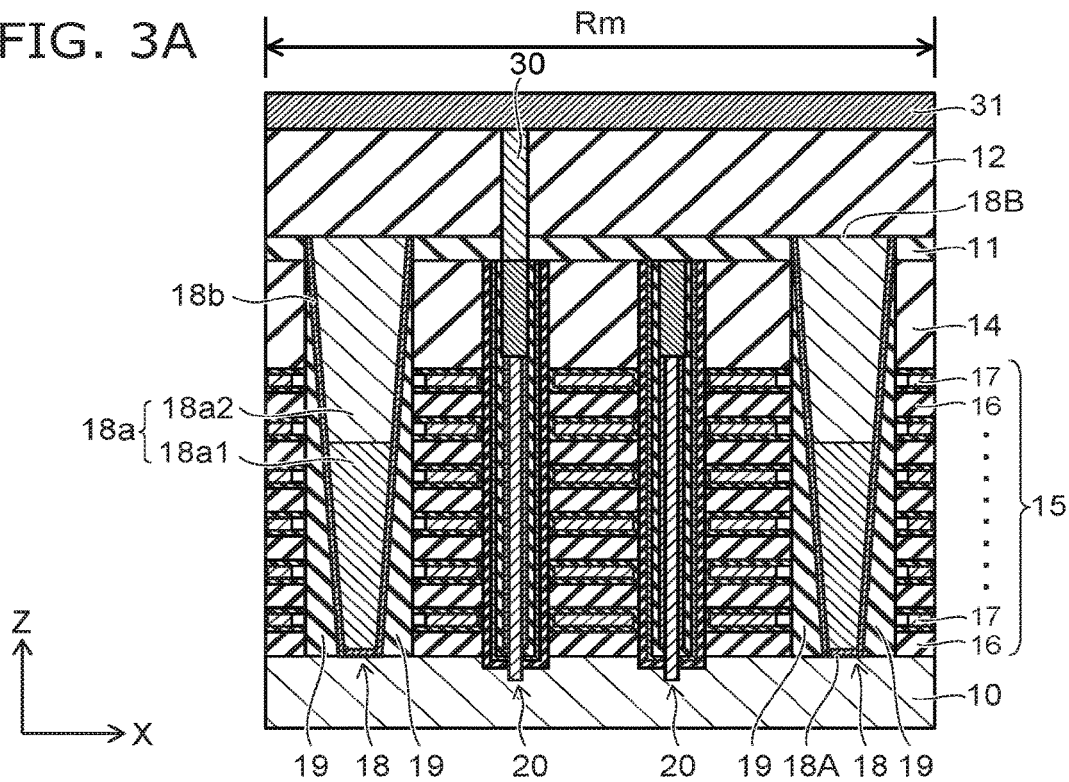
FIG. 3A and FIG. 3B are schematic sectional views showing portions of the semiconductor memory device according to the first embodiment.
Figure 3B:
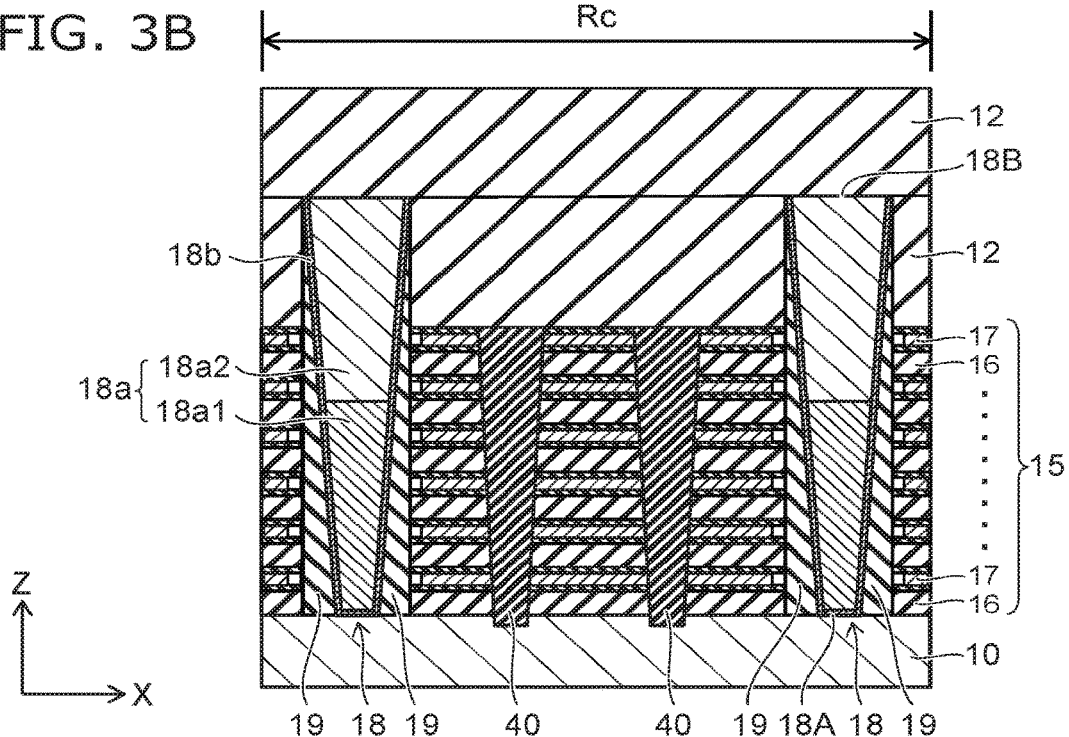

FIG. 3A and FIG. 3B are schematic sectional views showing portions of the semiconductor memory device according to the first embodiment.

FIG. 1 shows a plan view of a semiconductor memory device 1. FIG. 2 shows a Y-Z sectional view of the semiconductor memory device 1. FIG. 3A shows a X-Z sectional view of a memory cell region Rm in the semiconductor memory device 1. FIG. 3B shows a X-Z sectional view of a contact region Rc in the semiconductor memory device 1.

In the semiconductor memory device 1 according to the embodiment, a substrate 10 such as a silicon substrate is provided. Hereinafter, in the specification, an XYZ orthogonal coordinate system is employed for convenience of description. Two directions parallel to an upper surface of the substrate 10 and orthogonal to each other are defined as the "X-direction" and the "Y-direction", and a direction vertical to the upper surface of the substrate 10 is defined as the "Z-direction".

As shown in FIG. 1 and FIG. 2, in the semiconductor memory device 1, a memory cell region Rm and a contact region Rc are provided. The memory cell region Rm and the contact region Rc are arranged along the Y-direction.

Hereinafter, the memory cell region Rm will be described.

In the memory cell region Rm, stacked bodies 15 and silicon pillars 20 are provided. In the stacked body 15, a plurality of insulating films 16 and a plurality of electrode films 17 are alternately stacked one by one in the Z-direction. An inter-layer insulating film 14 is provided on the uppermost electrode film 17. The insulating film 16 is formed of, for example, silicon oxide ($SiO_2$). In the electrode film 17, a main body portion made of, for example, tungsten (W) or molybdenum (Mo), and a barrier metal layer made of, for example, titanium nitride and covering a surface of the main body portion are provided.

The silicon pillar 20 extends in the Z-direction. The silicon pillar 20 pierces the inter-layer insulating film 14 and the stacked body 15, and a lower end of the silicon pillar 20 is in contact with the substrate 10. As shown in FIG. 1, the silicon pillars 20 are disposed in, for example, a staggered manner. The inter-layer insulating film 14 is formed of, for example, silicon oxide.

In each of the silicon pillars 20, a circular cylindrical core portion 20a positioned within the stacked body 15 and constituting the central portion of the silicon pillar 20, a circular tubular cover layer 20b provided around the core portion 20a, and a plug portion 20c provided on the core portion 20a and the cover layer 20b and positioned within the inter-layer insulating film 14 are provided. The silicon pillar 20 is a structure including semiconductor layers corresponding to the core portion 20a and the cover layer 20b. The silicon pillar 20 is formed of polysilicon as a whole. The shape of the core portion 20a may be a circular tubular shape, and an insulating member may be provided in the interior thereof.

A tunnel insulating film 21 is provided around the silicon pillar 20, that is, on a side surface thereof. The tunnel insulating film 21 is, for example, a silicon oxide film of a single layer, or an ONO film in which a silicon oxide layer, a silicon nitride layer, and a silicon oxide layer are stacked. A charge storage film 22 is provided around the tunnel insulating film 21. The charge storage film 22 is a film for storing electrical charges. For example, the charge storage film 22 is formed of a material having an electron trapping site, for example, silicon nitride ($Si_3N_4$).

A silicon oxide layer 23a made of silicon oxide is provided around the charge storage film 22. An aluminum oxide layer 23b made of aluminum oxide ($Al_2O_3$) is provided between the silicon oxide layer 23a and the electrode film 17 and between the insulating film 16 and the electrode film 17. A block insulating film 23 is configured of the silicon oxide layer 23a and the aluminum oxide layer 23b. A memory film capable of storing electrical charges is configured of the tunnel insulating film 21, the charge storage film 22, and the block insulating film 23. Accordingly, the memory film is disposed between the silicon pillar 20 and the electrode film 17.

A plug 30 extending in the Z-direction and piercing insulating films 11, 12 is provided in a region directly on the silicon pillar 20. The plug 30 is formed of, for example, a conductive material such as tungsten. The insulating films 11, 12 are formed of, for example, silicon oxide. Bit lines 31 extending in the X-direction are provided on the insulating film 12. Each of the bit lines 31 is connected via one plug 30 to one silicon pillar 20 for each of the stacked bodies 15.

A plurality of source electrodes 18 are provided on the substrate 10. The source electrode 18 will be described in detail later.

Hereinafter, the contact region Rc will be described.

In the contact region Rc, the shape of an end portion of the stacked body 15 is a stepped shape, and a step 17s is formed for each of the electrode films 17. An insulating film 13 also covers the stepped-shaped end portion of the stacked body 15, and an upper surface of the insulating film 13 is flat. The insulating film 13 is formed of, for example, silicon oxide.

Columnar members 40 are provided above each step 17s of each stacked body 15 and penetrate the respective insulating film 13 and stacked body 15 in the Z-direction. Two adjacent columnar members 40 are separated from each other along the X-direction, and a plurality of groups 40p of the two columnar members 40 are provided along the Y-direction and separated from each other. Here, each group 40p includes two columnar members 40, but each group 40p may include any number of columnar members 40. For example, the columnar member 40 is a cylinder-shaped or polygonal column-shaped and is formed of silicon oxide. For example, a lower end of the columnar member 40 is provided in the substrate 10.

A contact 32 is provided on each step 17s of each stacked body 15. Each of the contacts 32 extends in the Z-direction and pierces the insulating films 12, 13. The contact 32 is provided in the vicinity of the columnar member 40. A lower end of the contact 32 is connected to the electrode film 17. Although, in the embodiment, one contact 32 is connected to each of the electrode films 17, a plurality of contacts 32 may be connected to each of the electrode films 17.

A plurality of upper-layer word lines 33 extending in the Y-direction are provided on the insulating film 12. An upper end of the contact 32 is connected to the upper-layer word line 33. For this reason, each of the electrode films 17 is connected to one upper-layer word line 33 via the contact 32.

In the memory cell region Rm, the silicon pillar 20 is connected between the substrate 10 and the bit line 31. Moreover, in each of the electrode films 17, a plurality of blocks are disposed in an X-Y plane and forms a portion of an interconnect pattern. Moreover, each of the blocks corresponds to a portion of the electrode film 17 between the source electrodes 18 adjacent to each other and forms a word line as a control gate. For example, in each of the blocks, four rows of the silicon pillars 20, each row of which is composed of a plurality of silicon pillars 20 arranged in a predetermined direction, are disposed. Each of the bit lines 31 extends in the X-direction over the plurality of blocks and is connected to one silicon pillar 20 for each of the blocks. A memory cell including the memory film is formed at each intersection between the silicon pillars 20 and the electrode films 17.

In the memory cell region Rm, a large number of memory cells are arranged in a three-dimensional matrix along the X-direction, the Y-direction, and the Z-direction, and data can be stored in each of the memory cells. On the other hand, in the contact region Rc, each of the electrode films 17 is led out of the memory cell region Rm and connected to a peripheral circuit (not shown) via the contact 32 and the upper-layer word line 33.

Hereinafter, the source electrode 18 will be described.

As shown in FIGS. 3A and 3B, the plurality of source electrodes 18 are provided in the memory cell region Rm and the contact region Rc. The plurality of source electrodes 18 are separated from each other along the X-direction so as to be arranged at equal intervals. The plurality of source electrodes 18 extend in the Y-direction. A lower end portion 18A of the source electrode 18 is in contact with the upper surface of the substrate 10. Since an upper portion of the substrate 10 has conductivity, the source electrode 18 is electrically connected with the substrate 10. For example, the thickness of the source electrode 18 in a cross section taken in the X-direction is smallest at the lower end portion 18A, increases moving upwards, and is greatest at an upper end portion 18B. The source electrode 18 may be provided such that the width of the upper end portion 18B in the X-direction and the width of the lower end portion 18A in the X-direction are the same as each other.

In the memory cell region Rm, between each two adjacent source electrodes 18 in the X-direction, the stacked body 15, the inter-layer insulating film 14, and the insulating film 11 are provided in that order from bottom to top. The insulating film 11, the inter-layer insulating film 14, and the stacked body 15 are divided by the source electrodes 18 and extend in the Y-direction. Therefore, the insulating films 16 and the electrode films 17 also extend in the Y-direction.

In the contact region Rc, between each two adjacent source electrodes 18 in the X-direction, the stacked body 15, the insulating film 13, and the insulating film 12 are provided in that order from bottom to top. The columnar members 40 penetrate the stacked body 15 and insulating film 13 in the Z-direction. As described above, in the contact region Rc, the stacked body 15 is provided such that the shape of the end portion is a stepped shape in −Y-direction. Thereby, the insulating film 12, the insulating film 13, and the stacked body 15 are divided by the source electrodes 18 and extend in the Y-direction. Since FIG. 3B shows a sectional view of the contact region Rc viewed from the Y-direction, the insulating film 13 is not shown in FIG. 3B.

Each of the source electrodes 18 includes a main body portion 18a and a peripheral portion 18b. The main body portion 18a includes a lower portion 18a1 and an upper portion 18a2. The lower portion 18a1 and the upper portion 18a2 refer to portions positioned at lower and upper sides of the source electrode 18 when it is divided into two portions in the Z-direction. The lower portion 18a1 and the upper portion 18a2 extend in the Y-direction. For example, the length of the lower portion 18a1 in the Z-direction is smaller than the length of the upper portion 18a2 in the Z-direction. The length of the lower portion 18a1 in the Z-direction may be equal to the length of the upper portion 18a2 in the Z-direction.

The lower portion 18a1 has a compressive stress. The lower portion 18a1 is formed of a material having a compressive stress. Here, in the specification, the "material having a compressive stress" is a material that a lattice constant becomes smaller than the original lattice constant in a single film formed thereof. The lattice constant of the material having a compressive stress is measured using a X-Ray diffraction method or an electron diffraction method or the like. By adding the material having a compressive stress, in a material that a lattice constant becomes larger than the original lattice constant, the material can be change so as to make a lattice spacing close to the original lattice spacing.

For example, in view of the thermal expansion of the manufacturing process, the lower portion 18a1 is formed of a material whose linear expansion coefficient is lower than the linear expansion coefficient of silicon (Si). For example, the linear expansion coefficient of silicon is $2.4 \times 10^{-6}/°$ C., and, the linear expansion coefficient of silicon oxide ($SiO_2$) is $0.5 \times 10^{-6}/°$ C.

For example, a difference between the linear expansion coefficient of the material of the lower portion 18a1 and the linear expansion coefficient of silicon is smaller than a difference between the linear expansion coefficient of the material of the upper portion 18a2 and the linear expansion coefficient of silicon. For example, the linear expansion coefficient of silicon nitride (SiN) is $4.0 \times 10^{-6}/°$ C., and, the linear expansion coefficient of tungsten is $4.3 \times 10^{-6}/°$ C. When the linear expansion coefficient of silicon is $2.4 \times 10^{-6}/°$ C., a difference between the linear expansion coefficients of silicon nitride and silicon is $1.6 \times 10^{-6}/°$ C., and, a difference between the linear expansion coefficients of tungsten and silicon is $1.9 \times 10^{-6}/°$ C.

For example, the lower portion 18a1 may be formed of a material having insulation. For example, the lower portion 18a1 may be formed of silicon oxide ($SiO_2$) or silicon nitride (SiN).

For example, the lower portion 18a1 may be formed of a material having conductivity. For example, the lower portion 18a1 may be formed of diamond doped with boron (B). For example, the lower portion 18a1 may be formed by performing the oxidation of a portion of polysilicon. The lower portion 18a1 may be formed by introducing into polysilicon an impurity whose ion radius is larger than that of silicon, and then performing the annealing of the polysilicon.

For example, the lower portion 18a1 may be formed of a compound containing metal. For example, the lower portion 18a1 may be formed of titanium nitride. Examples of titanium compound include titanium nitride (TiN), titanium silicide (TiSi), and titanium aluminum nitride (TiAlN). For example, the lower portion 18a1 may be formed of iridium oxide ($IrO_x$). The lower portion 18a1 may be formed of some of these materials. The lower portion 18a1 may be buried by forming a film by a CVD (Chemical Vapor Deposition) method, and then forming titanium nitride on the film by a PVD (Physical Vapor Deposition) method.

The upper portion 18a2 has conductivity. The upper portion 18a2 is formed of a metal material made of, for example, tungsten or molybdenum. The upper portion 18a2 has, for example, a tensile stress.

The peripheral portion 18b is, for example, a barrier metal layer made of titanium nitride (TiN) and covering a surface of the main body portion 18a. The peripheral portion 18b covers side and bottom faces of the lower portion 18a1, and a side face of the upper portion 18a2. Since the source electrode 18 includes the peripheral portion 18b, even if the lower portion 18a1 is formed of an insulating material, the source electrode 18 is electrically connected with the substrate 10.

In the memory cell region Rm, an insulating side wall 19 is provided between the source electrode 18 and a structure composed of the stacked body 15, the inter-layer insulating film 14 and the insulating film 11. On the other hand, in the contact region Rc, the side wall 19 is provided between the source electrode 18 and a structure composed of the stacked body 15, the insulating film 13 and the insulating film 12. The electrode film 17 is insulated from the source electrode 18 by the side wall 19. The side wall 19 also extends in the Y-direction. The side wall 19 is formed of, for example, silicon oxide.

Hereinafter, a method for manufacturing the semiconductor memory device according to the embodiment will be described.

FIG. 4A and FIG. 4B to FIG. 11A and FIG. 11B are diagrams showing the method for manufacturing the semiconductor memory device according to the first embodiment.

FIG. 4A and FIG. 4B to FIG. 11A and FIG. 11B show sectional views, respectively, showing the method for manufacturing the semiconductor memory device. The cross-sections of FIG. 4A to FIG. 11A correspond to the cross-section of FIG. 3A and the memory cell region Rm. The cross-sections of FIG. 4B to FIG. 11B correspond to the cross-section of FIG. 3B and the contact region Rc. FIG. 4A and FIG. 4B to FIG. 11A and FIG. 11B show portions downward from the source electrode 18.

First, on the substrate 10 as a portion of a wafer, the insulating films 16 and sacrifice films 50 are alternately stacked along the Z-direction by, for example, a CVD method to form a stacked body 15a. The insulating film 16 is formed of, for example, silicon oxide. The sacrifice film 50 is formed of a material with which etching selectivity is obtained between the insulating film 16 and the sacrifice film 50, and is formed of, for example, silicon nitride.

Subsequently, in the memory cell region Rm, the inter-layer insulating film 14 is formed on the stacked body 15a. In the contact region Rc, the stacked body 15a is processed into a stepped shape to form a step for each of the sacrifice films 50. Then, the insulating film 13 (not shown) is formed on the substrate 10 so as to cover the stacked body 15a.

Figure 4A:
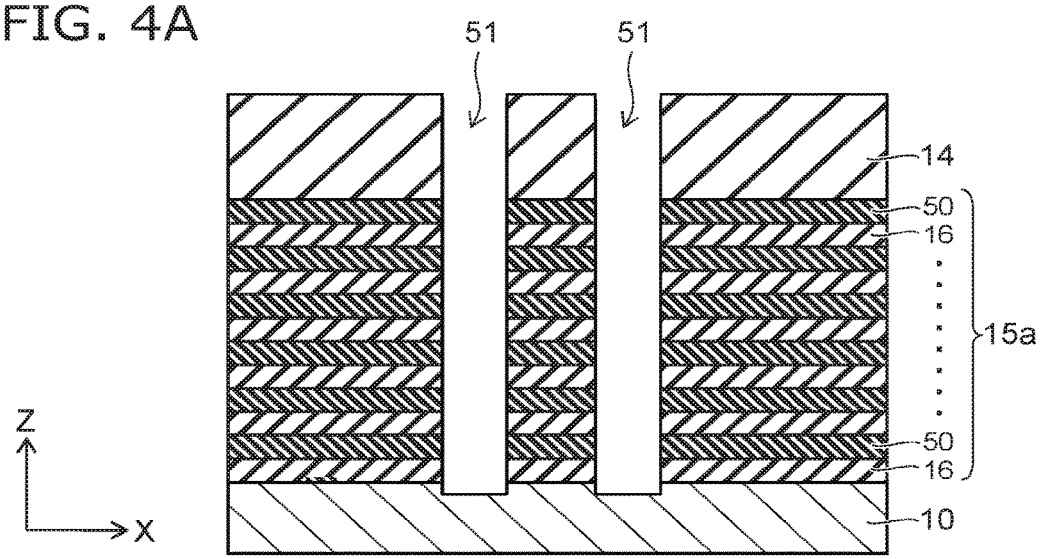

Next, as shown in FIG. 4A, in the memory cell region Rm, a plurality of memory holes 51 (through-holes) are formed in the inter-layer insulating film 14 and the stacked body 15a by, for example, RIE (Reactive Ion Etching). The memory hole 51 extends in the Z-direction to pierce the inter-layer insulating film 14 and the stacked body 15a, and reaches the substrate 10. When viewed from the Z-direction, the shape of the memory hole 51 may be a circular. For example, when viewed from the Z-direction, the memory holes 51 are disposed in a staggered pattern.

Figure 4B:
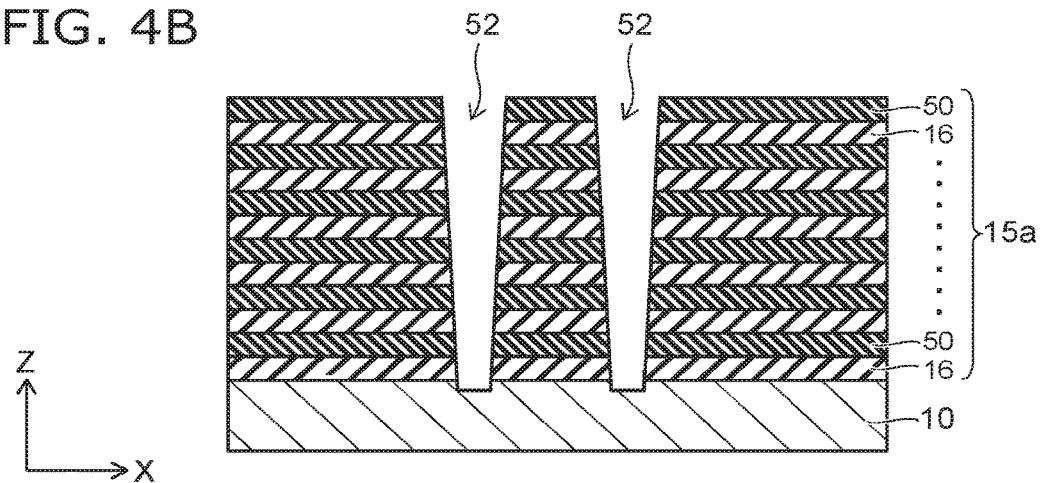

On the other hand, as shown in FIG. 4B, in the contact region Rc, a plurality of holes 52 are formed by, for example, RIE. The hole 52 extends in the Z-direction to pierce the insulating film 13 and the stacked body 15a. The hole 52 pierces a portion of the substrate 10.

Figure 5A:
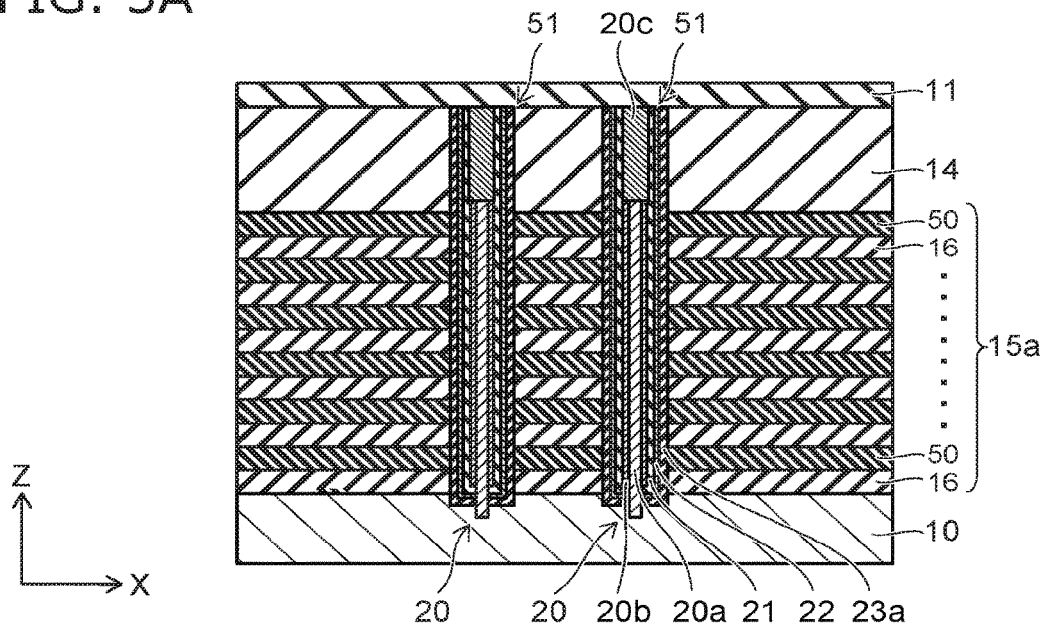

Next, as shown in FIG. 5A, in the memory cell region Rm, by, for example, a CVD method, silicon oxide is deposited on an inner surface of the memory hole 51 to form the silicon oxide layer 23a, silicon nitride is deposited to form the charge storage film 22, silicon oxide is deposited to form the tunnel insulating film 21, and silicon is deposited to form the cover layer 20b. Then, by applying RIE, the cover layer 20b, the tunnel insulating film 21, the charge storage film 22, and the silicon oxide layer 23a are removed from a bottom surface of the memory hole 51 to expose the substrate 10. Subsequently, silicon is deposited to form the core portion 20a. The core portion 20a reaches the substrate 10 and is in contact with the substrate 10. Then, etch-back is applied to remove upper portions of the cover layer 20b and the core portion 20a, and silicon into which an impurity is introduced is buried to form the plug portion 20c. Due to this, the silicon pillar 20 is formed in the memory hole 51. Subsequently, the insulating film 11 is formed on the inter-layer insulating film 14.

Figure 5B:
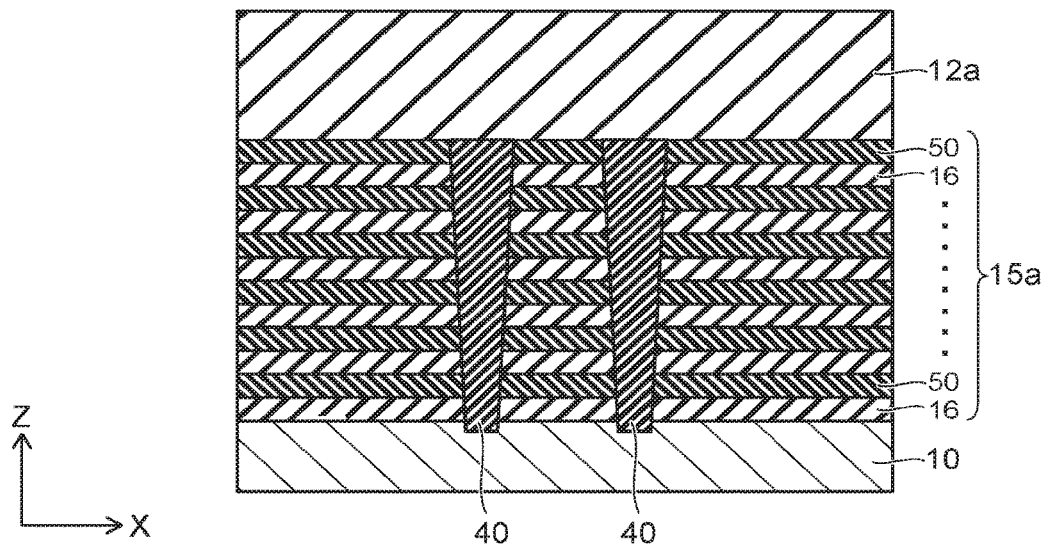

On the other hand, as shown in FIG. 5B, in the contact region Rc, by, for example, a CVD method, silicon oxide is deposited on an inner surface of the hole 52 to form the columnar member 40. A portion of the columnar member 40 is buried in the substrate 10. Subsequently, an insulating film 12a is formed on the insulating film 13 and the stacked body 15a. The insulating film 12a is a portion of the insulating film 12.

Figure 6A:
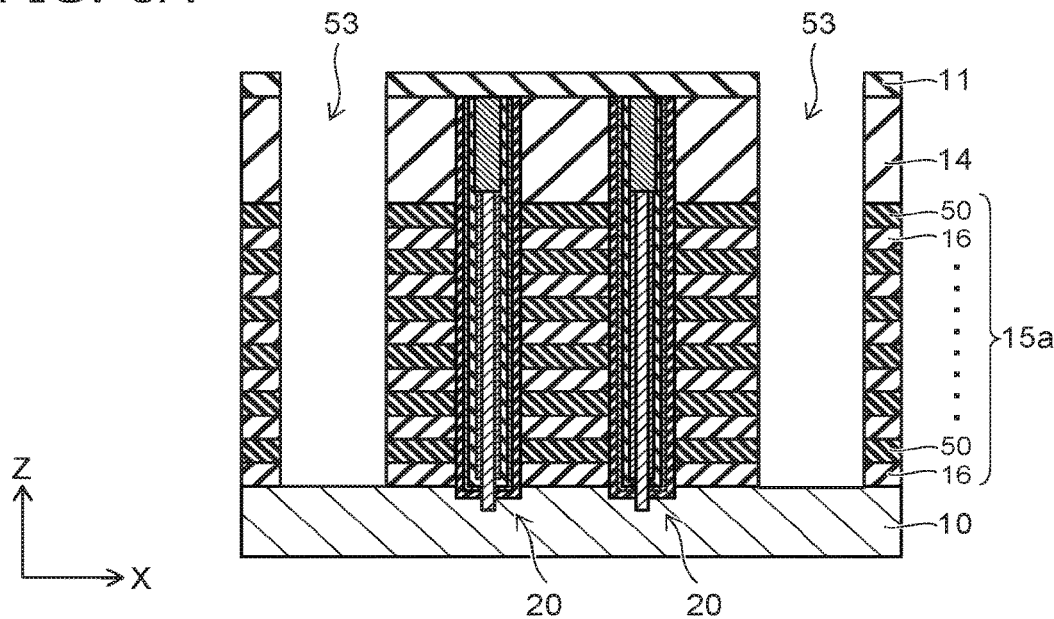
Figure 6B:
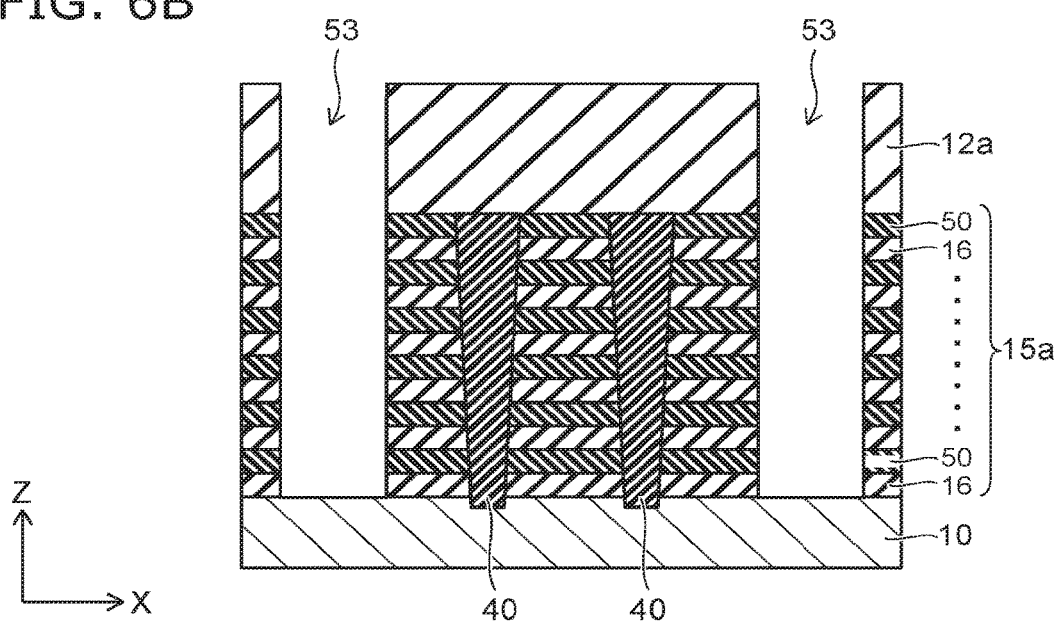

Next, as shown in FIG. 6A and FIG. 6B, a plurality of slits 53 extending in the Y-direction are formed in the stacked body 15a by, for example, anisotropic etching such as RIE. The slits 53 are caused to pierce the stacked body 15a. Due to this, the stacked body 15a is divided by the slits 53 into a plurality of stacked bodies extending in the Y-direction.

Figure 7A:
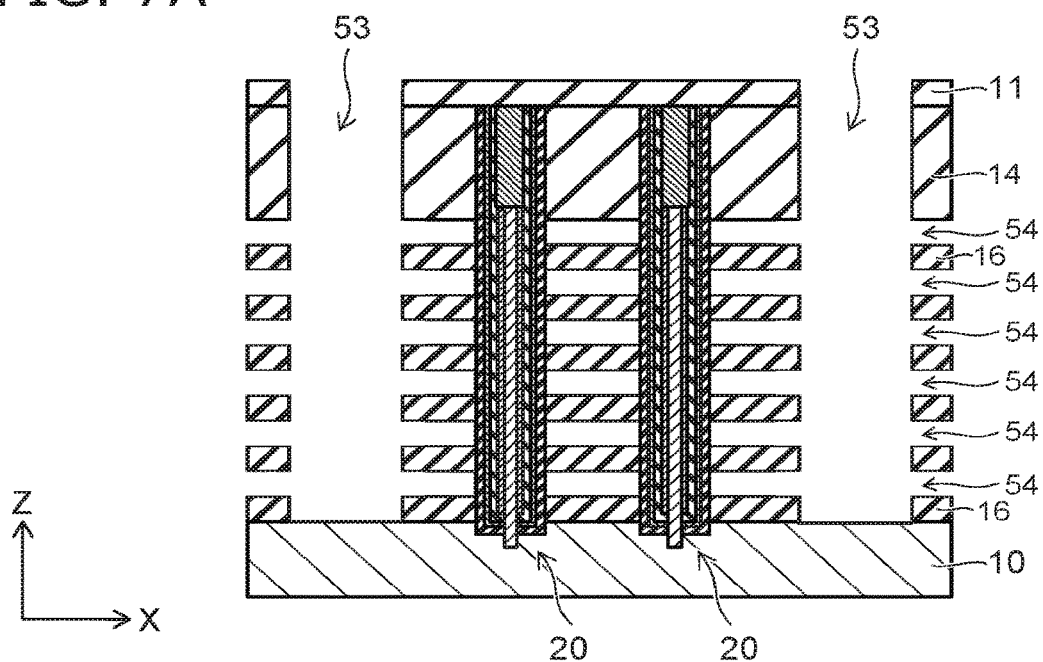
Figure 7B:
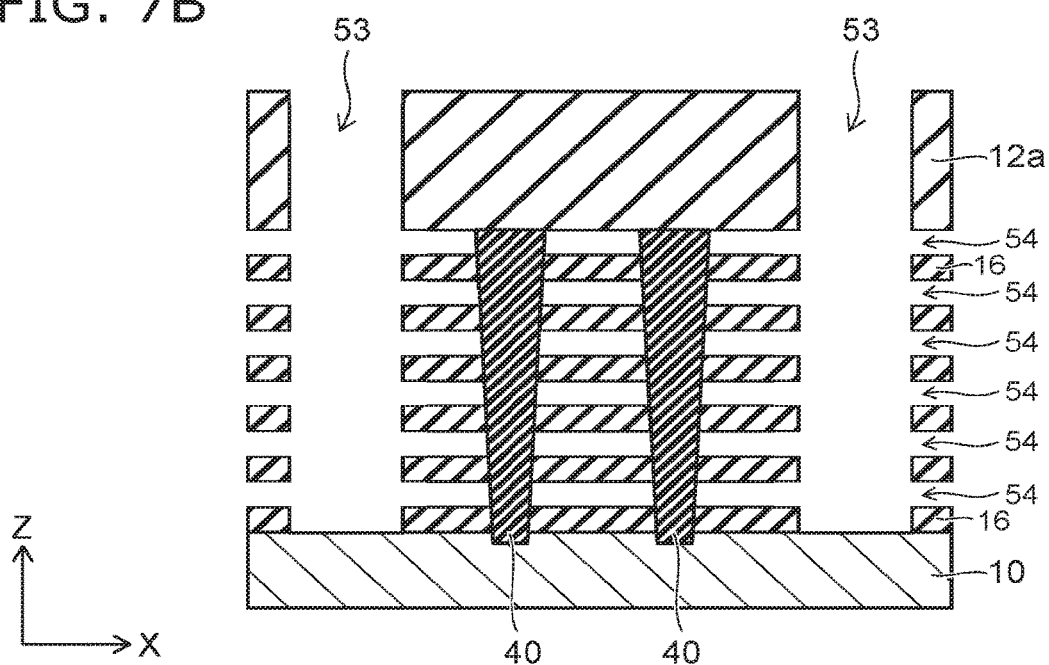

Next, as shown in FIG. 7A and FIG. 7B, the sacrifice films 50 are removed by applying wet etching through the slits 53. For example, when the sacrifice films 50 are formed of silicon nitride, phosphoric acid is used as the etchant of the wet etching. Removing the sacrifice films 50 through the slits 53 forms cavities 54.

Figure 8A:
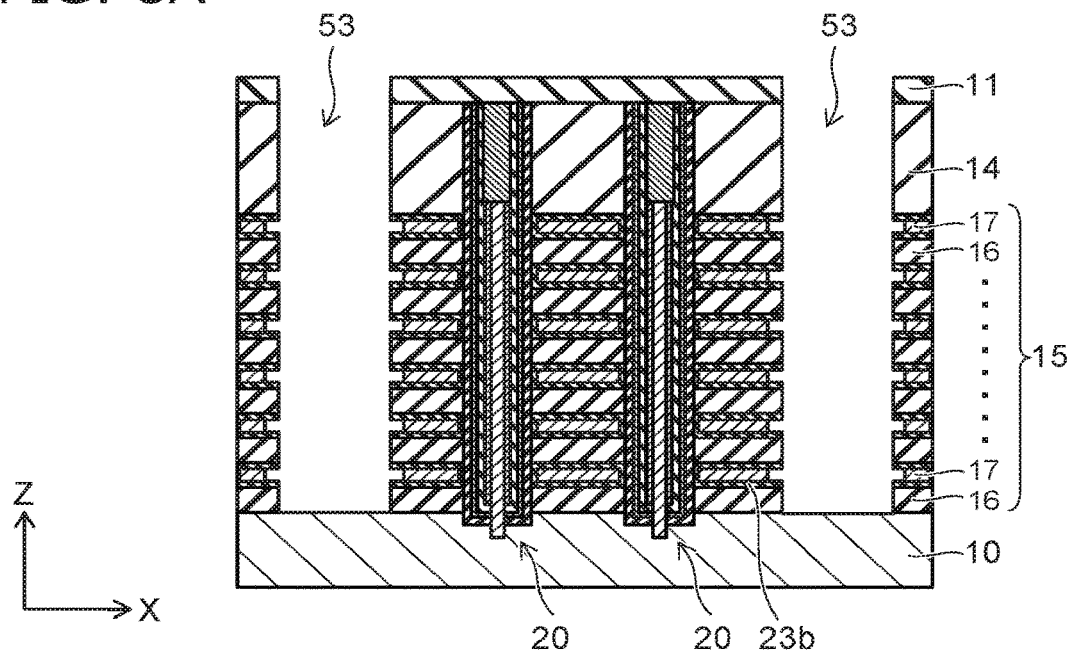
Figure 8B:
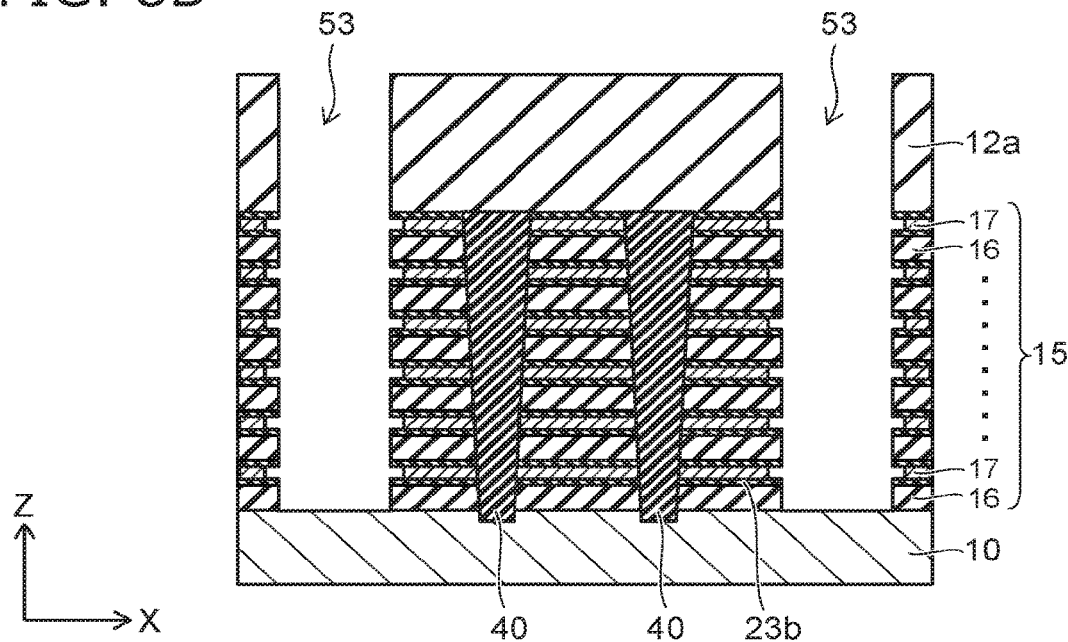

Next, as shown in FIG. 8A and FIG. 8B, after the aluminum oxide layer 23b is formed through the slits 53, a conductive film such as tungsten or molybdenum is deposited to be buried in the cavities 54. Due to this, the electrode film 17 is formed in the cavity 54. The sacrifice film 50 is replaced with the electrode film 17, and the stacked body 15 is formed between the slits 53.

Figure 9A:
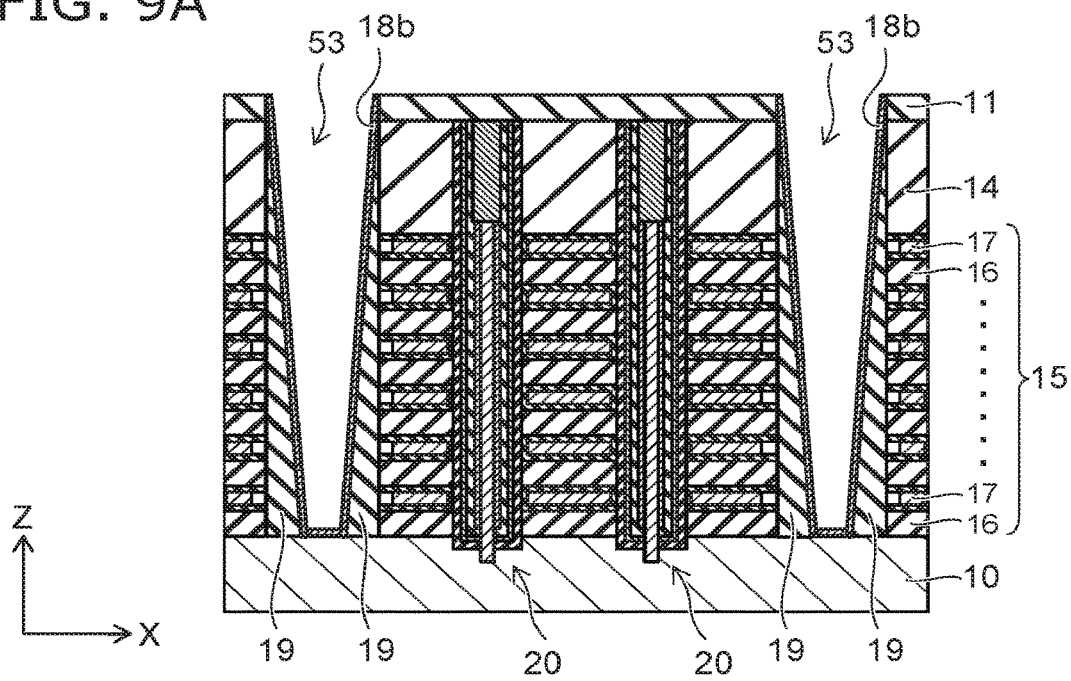
Figure 9B:
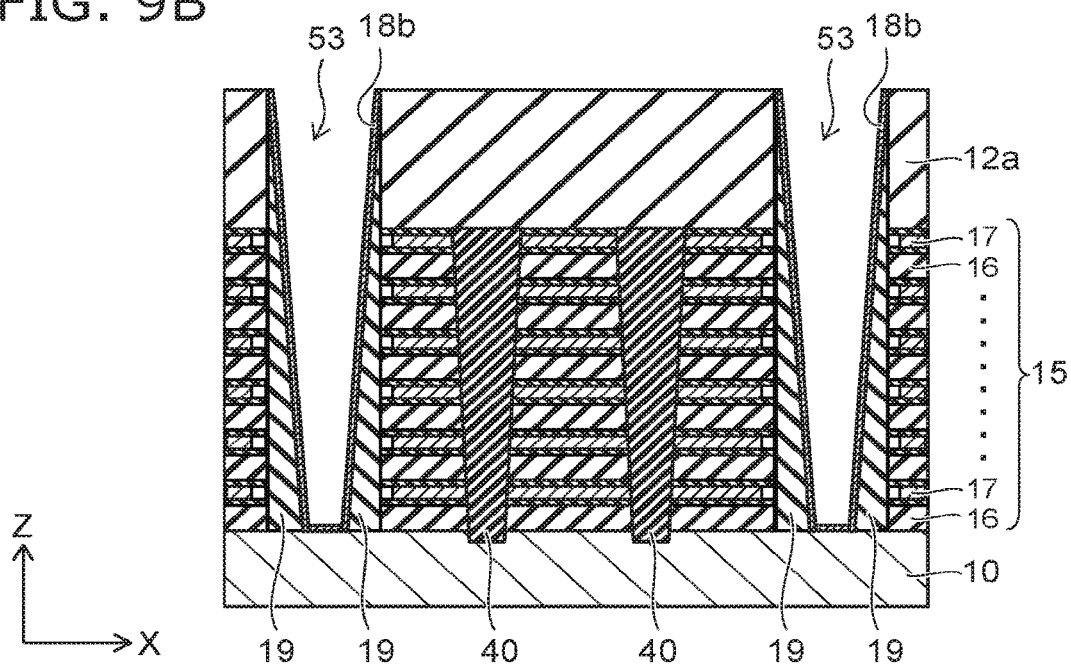

Next, as shown in FIG. 9A and FIG. 9B, after silicon oxide is deposited on the entire surface to form an insulating film, the side wall 19 is formed by etching back the insulating film and leaving the insulating film on a side surface of the slit 53. Subsequently, a barrier metal layer is formed by depositing titanium nitride to be thin. Due to this, the peripheral portion 18b is formed.

Figure 10A:
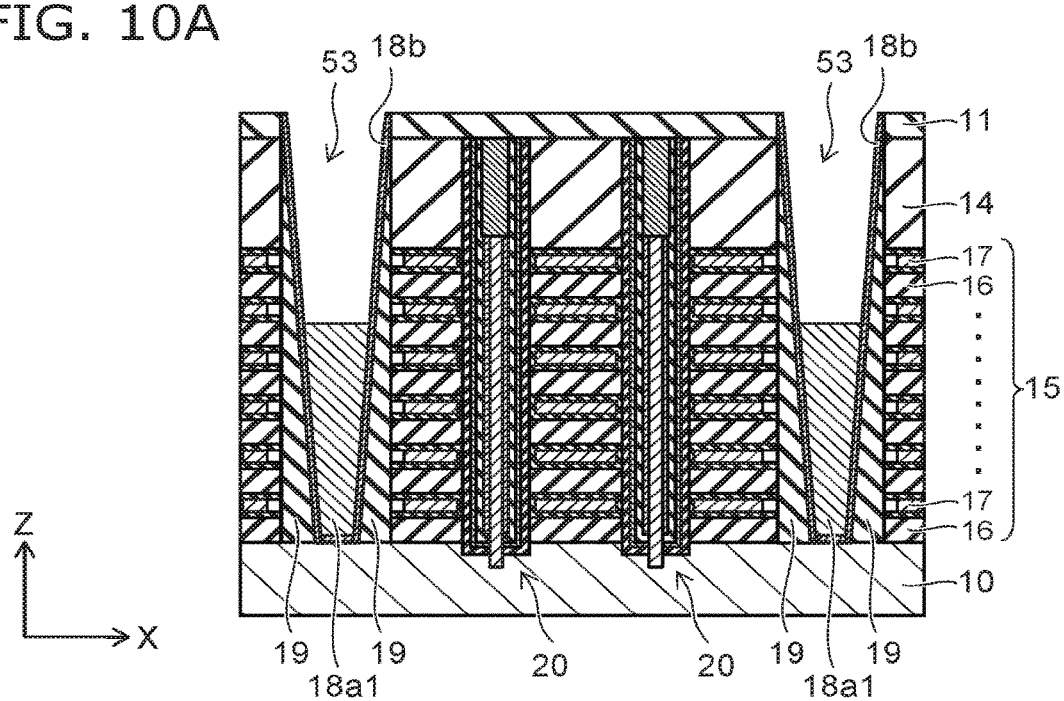
Figure 10B:
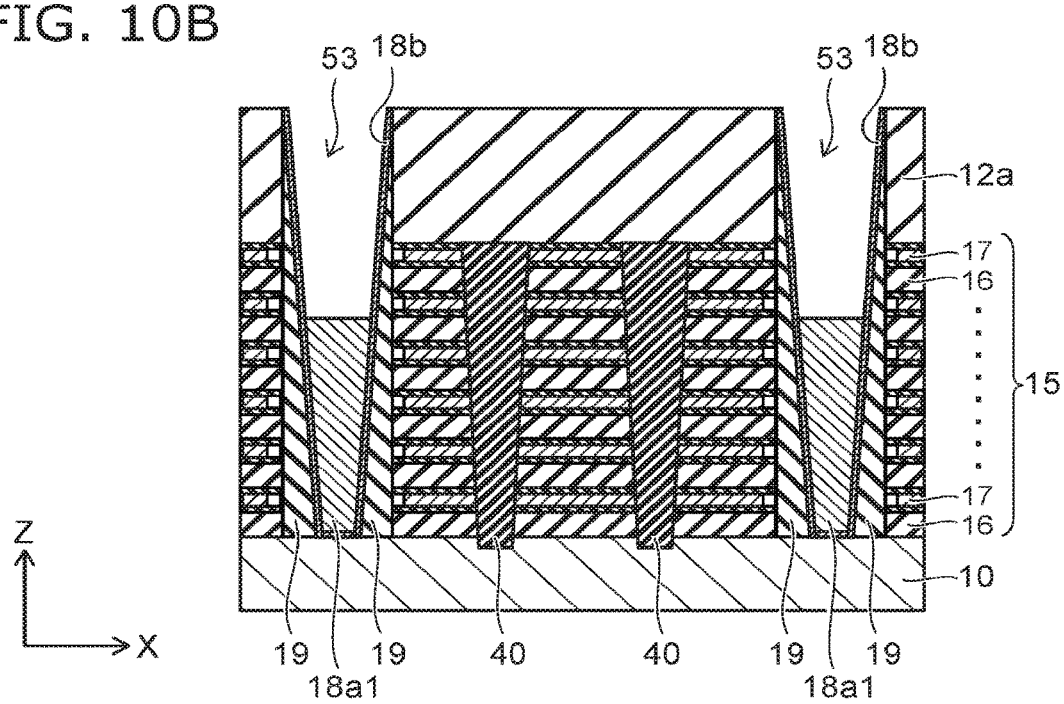

Next, as shown in FIG. 10A and FIG. 10B, for example, silicon oxide is deposited to be thick. Due to this, the lower portion 18a1 is formed in the slit 53. The lower portion 18a1 is formed of various materials having a compressive stress.

Figure 11A:
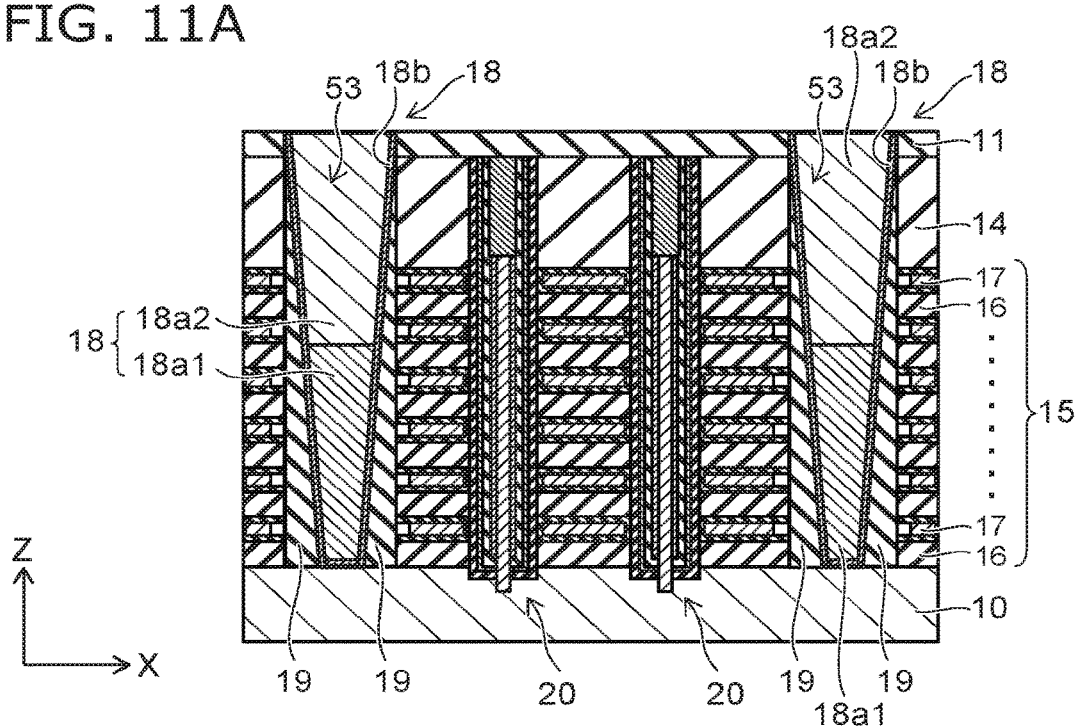
Figure 11B:
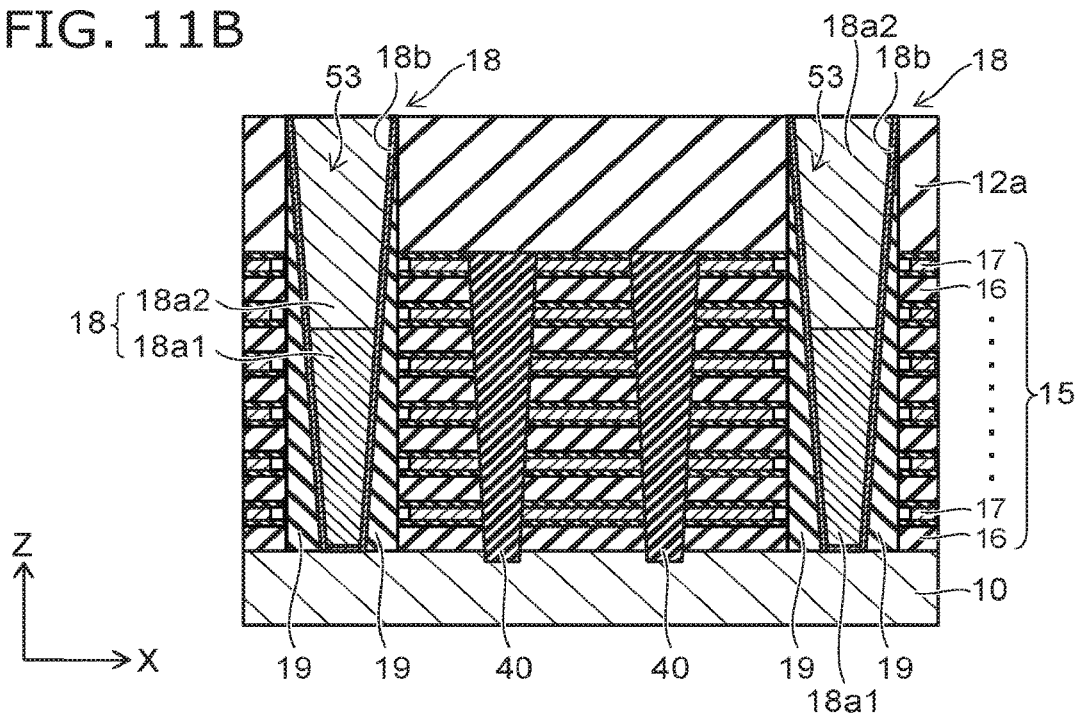

Next, as shown in FIG. 11A and FIG. 11B, a conductive film is formed by depositing tungsten or molybdenum to be thick. Due to this, the upper portion 18a2 is formed in the slit 53. The main body portion 18a including the lower portion 18a1 and the upper portion 18a2 is formed in the slit 53. The source electrode 18 including the main body portion 18a and the peripheral portion 18b is formed such that the peripheral portion 18b covers a surface of the main body portion 18a.

Thereafter, the plug 30 and bit lines 31 are formed in the memory cell region Rm, and, the contacts 32 and upper-layer word lines 33 are formed in the contact region Rc. Subsequently, a plurality of semiconductor memory devices 1 are divided by dicing the wafer.

In this manner, the semiconductor memory device 1 according to the embodiment is manufactured.

Hereinafter, advantages of the embodiment will be described.

In a semiconductor memory device having a three-dimensional structure, it is possible to drive a large number of memory cells by disposing a large number of silicon pillars in the electrode film. On the other hand, as increasing the number of silicon pillars disposed in the electrode film, the semiconductor memory device has a stacked structure that the electrode film is long in the Y-direction. Further, in the case where the electrode film is formed of a metal material, a tensile stress is likely to occur in the Y-direction and a compressive stress is likely to occur in the X-direction. By such as a stress occurring on one side of the substrate, the substrate warps greatly.

Since there is a difference in the stress of the electrode film between the X-direction and the Y-direction, there is a difference in direction of the warp of the substrate between the X-direction and the Y-direction. Further, in the case where the semiconductor memory device has a stacked structure that the electrode film is long in the Y-direction, the stacked structure increases the difference of the warp of the substrate between the X-direction and the Y-direction. Due to this, since the stress is likely to be added to the Y-direction, the substrate warps greatly.

The plurality of semiconductor memory devices are manufactured by forming the structure on a wafer including the substrate, and then dicing the wafer and the structure. Therefore, the warp of the substrate appears as a warp of the wafer before the dicing. The great warp of the wafer deteriorates the accuracy in the manufacturing process, and hinders the stable operation of the manufacturing device.

As the embodiment, the lower portion 18a1 of the source electrode 18 is formed of a material having the compressive stress. When the source electrode 18 is provided in this manner, it is possible to relax the tensile stress which occurs in the Y-direction of the electrode film 17. Thereby, it is possible to reduce the difference of the warp of the substrate 10 between the X-direction and the Y-direction. Due to this, it is possible to suppress the warp of the substrate 10 and suppress the warp and crack of the wafer.

When the lower portion 18a1 is formed of a material (for example, silicon oxide) whose linear expansion coefficient is lower than the linear expansion coefficient of silicon, or a material (for example, silicon nitride) so that the difference of the linear expansion coefficient between the lower portion 18a1 and silicon is smaller than the difference of the linear expansion coefficient between the upper portion 18a2 and silicon, the tensile stress occurring in the Y-direction of the electrode film 17 is relaxed.

(Second Embodiment)

Figure 12A:
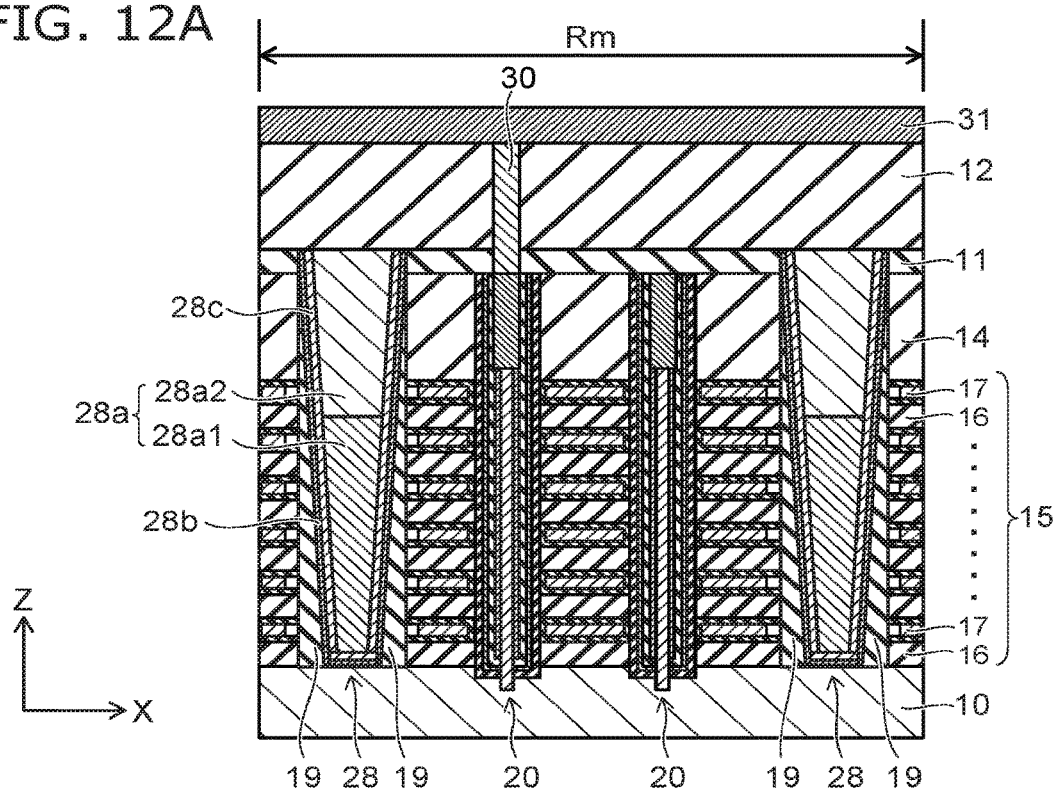
FIG. 12A and FIG. 12B are schematic sectional views showing portions of a semiconductor memory device according to a second embodiment.
Figure 12B:
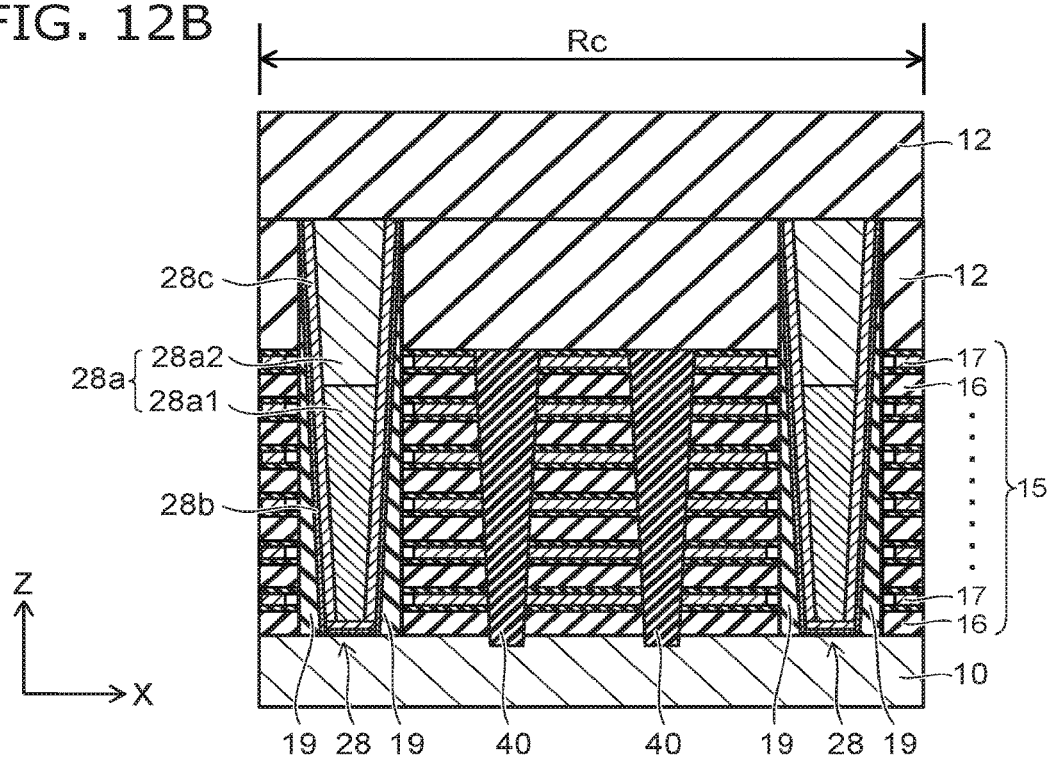

FIG. 12A and FIG. 12B are schematic sectional views showing portions of a semiconductor memory device according to a second embodiment.

Figure 13:
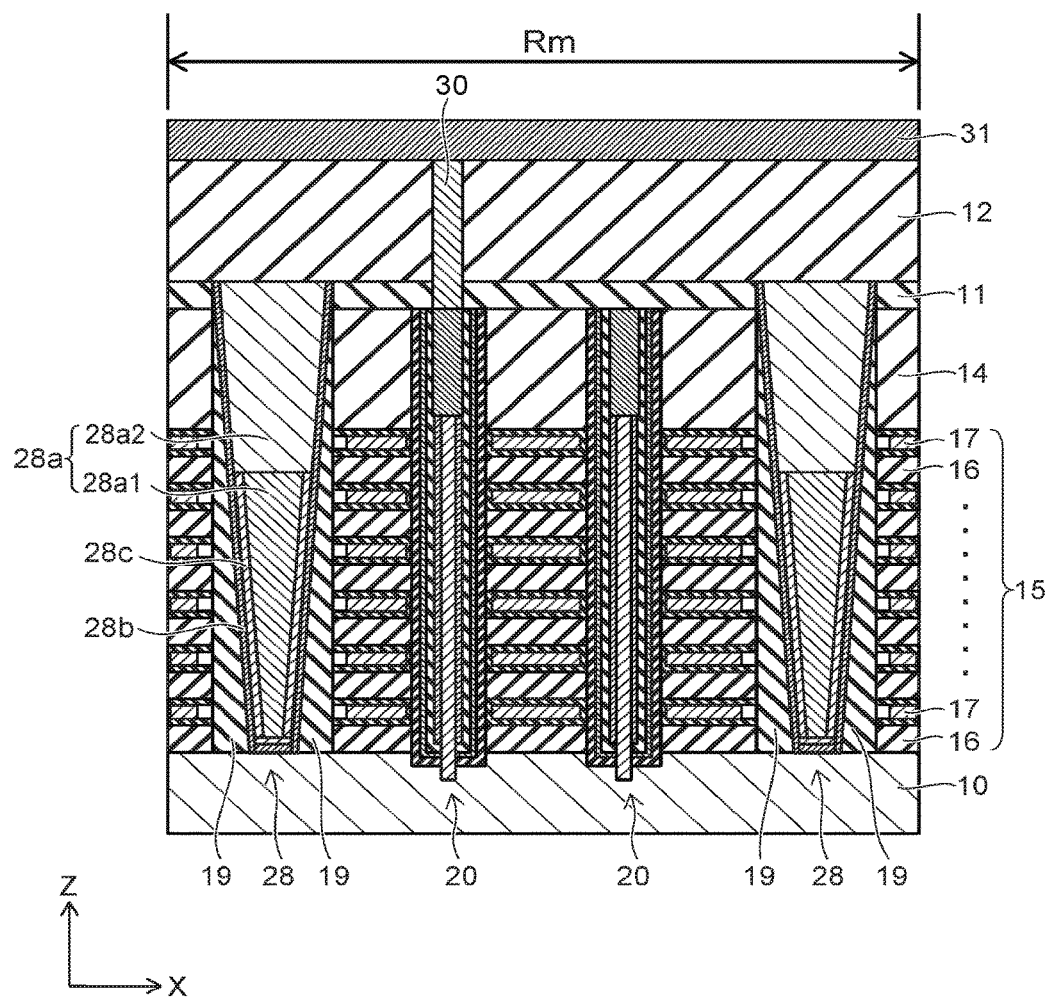
FIG. 13 is a schematic sectional view showing a portion of another semiconductor memory device according to the second embodiment.

FIG. 13 is a schematic sectional view showing a portion of another semiconductor memory device according to the second embodiment.

FIG. 12A shows a X-Z sectional view of the memory cell region Rm in the semiconductor memory device 1. FIG. 12B shows a X-Z sectional view of the contact region Rc in the semiconductor memory device 1. FIG. 13 shows a X-Z sectional view of the memory cell region Rm in the semiconductor memory device 1 according to the variation. The cross-section of FIG. 13 corresponds to the cross-section of FIG. 12A.

The embodiment and the first embodiment are different in a source electrode 28. Configurations other than the source electrode 28 are the same as the first embodiment, and therefore, a detailed description of other configurations is omitted.

Each of the source electrodes 28 includes a main body portion 28a, a peripheral portion 28b, and a conductive portion 28c. The main body portion 18a includes a lower portion 28a1 and an upper portion 28a2.

The lower portion 28a1 is formed of a material having a compressive stress. The upper portion 28a2 has conductivity, for example, is formed of a metal material made of tungsten or molybdenum. The peripheral portion 28b is, for example, a barrier metal layer made of titanium nitride (TiN) and covering a surface of the conductive portion 28c.

The conductive portion 28c is, for example, formed of a film including a metal material made of tungsten or molybdenum. The conductive portion 28c may be formed of a film including polysilicon. The conductive portion 28c may be formed of the same material as the upper portion 28a2.

The conductive portion 28c covers a surface of at least one portion of the main body portion 28a. For example, the conductive portion 28c covers side and bottom faces of the lower portion 28a1, and a side face of the upper portion 28a2. As shown in FIG. 13, the conductive portion 28c may be provided such that the conductive portion 28c covers the side and bottom faces of the lower portion 28a1 and the peripheral portion 28b covers the side face of the upper portion 28a2.

Hereinafter, a method for manufacturing the semiconductor memory device according to the embodiment will be described.

FIG. 14A and FIG. 14B to FIG. 16A and FIG. 16B are diagrams showing the method for manufacturing the semiconductor memory device according to the second embodiment.

In the method for manufacturing the semiconductor memory device of the second embodiment, a process for forming the source electrode 28 is different than in the method for manufacturing the semiconductor memory device of the first embodiment. Therefore, since the processes illustrated in FIGS. 4A and 4B to FIGS. 9A and 9B are the same in both the first embodiment and the second embodiment, drawings and descriptions of those processes will be omitted here.

FIG. 14A and FIG. 14B to FIG. 16A and FIG. 16B show sectional views, respectively, showing the method for manufacturing the semiconductor memory device. The cross-sections of FIG. 14A to FIG. 16A correspond to the cross-section of FIG. 12A and the memory cell region Rm. The cross-sections of FIG. 14B to FIG. 16B correspond to the cross-section of FIG. 12B and the contact region Rc. FIG. 14A and FIG. 14B to FIG. 16A and FIG. 16B show portions downward from the source electrode 28.

Figure 14A:
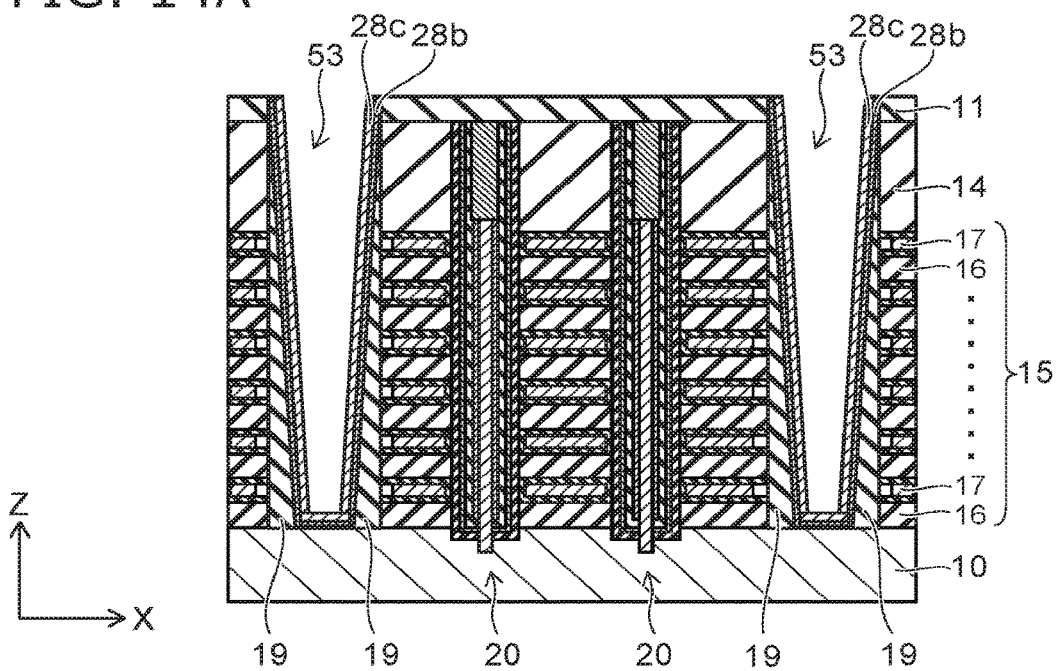
Figure 14B:
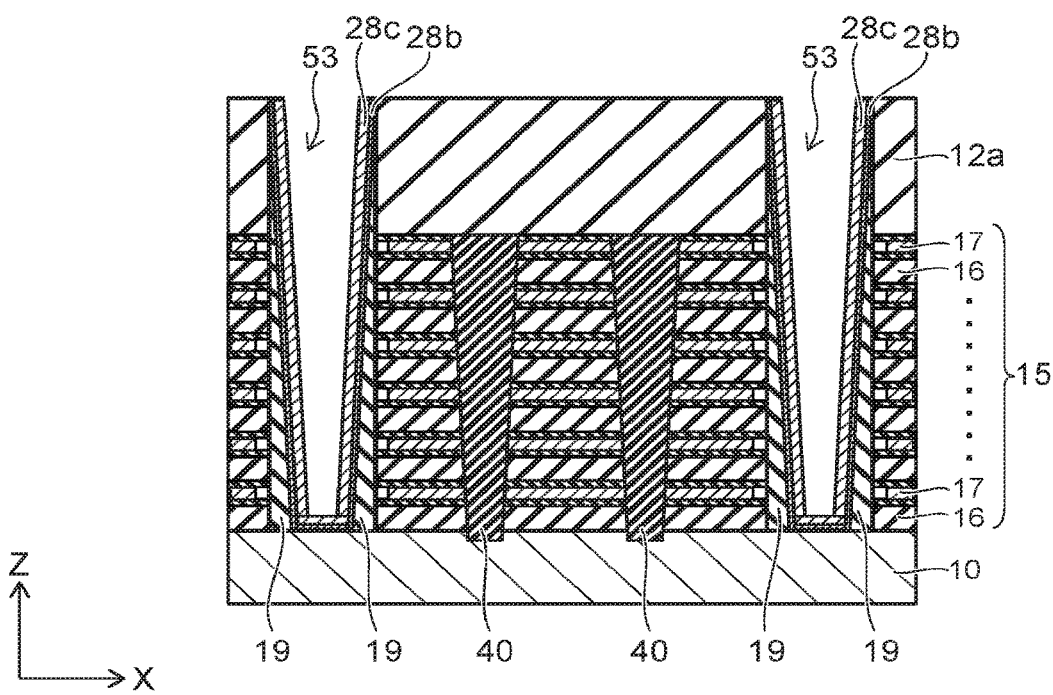

As shown in FIG. 14A and FIG. 14B, a conductive film is formed by depositing tungsten or molybdenum in the slit 53 to be thin. Due to this, the conductive portion 28c is formed in the slit 53. The conductive portion 28c may be formed so as to form the conductive film in the slit 53 and remove, by applying etching, a portion of the conductive film formed on a side face of the slit 53. In such a case, the conductive portion 28c is not formed on a portion of the peripheral portion 28b.

Figure 15A:
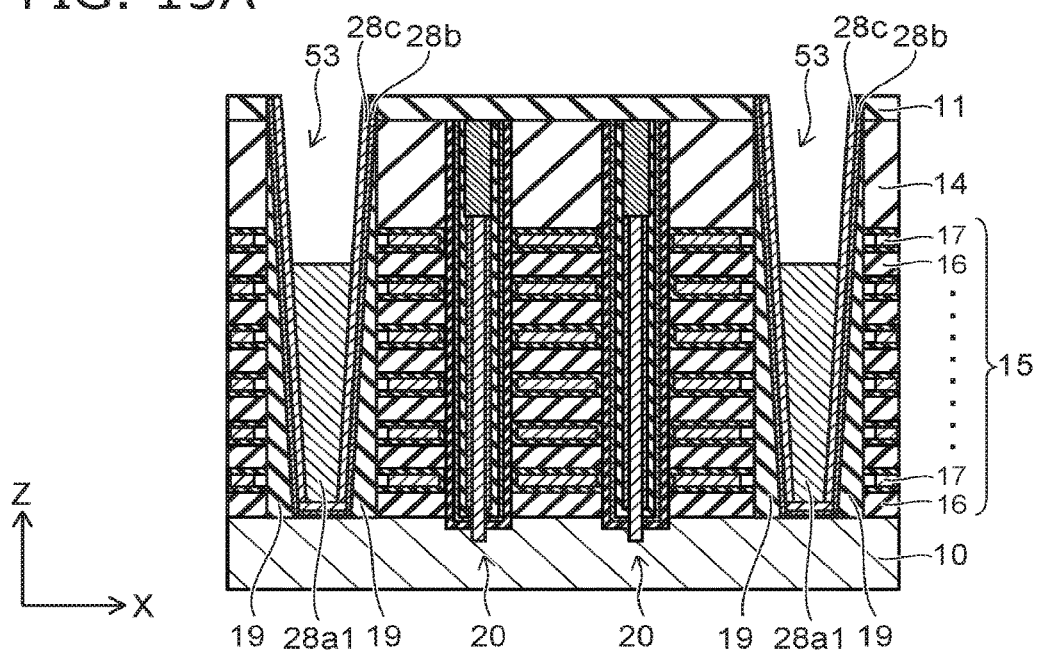
Figure 15B:
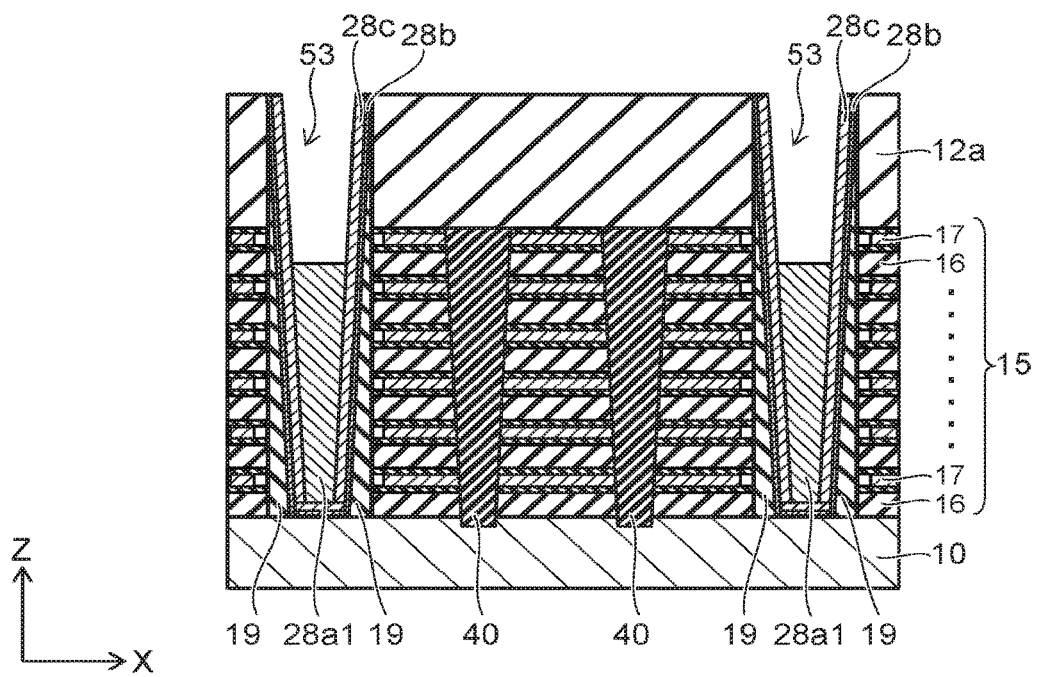

Next, as shown in FIG. 15A and FIG. 15B, for example, silicon oxide is deposited to be thick. Due to this, the lower portion 28a1 is formed in the slit 53. The lower portion 28a1 is formed of various materials having a compressive stress.

Figure 16A:
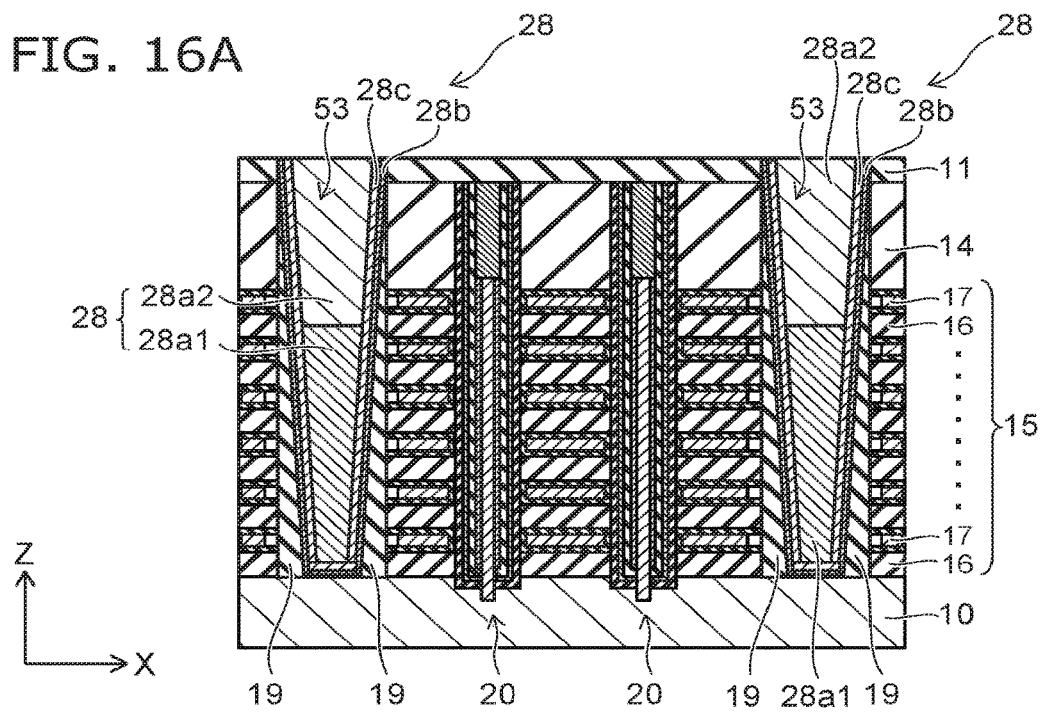
Figure 16B:
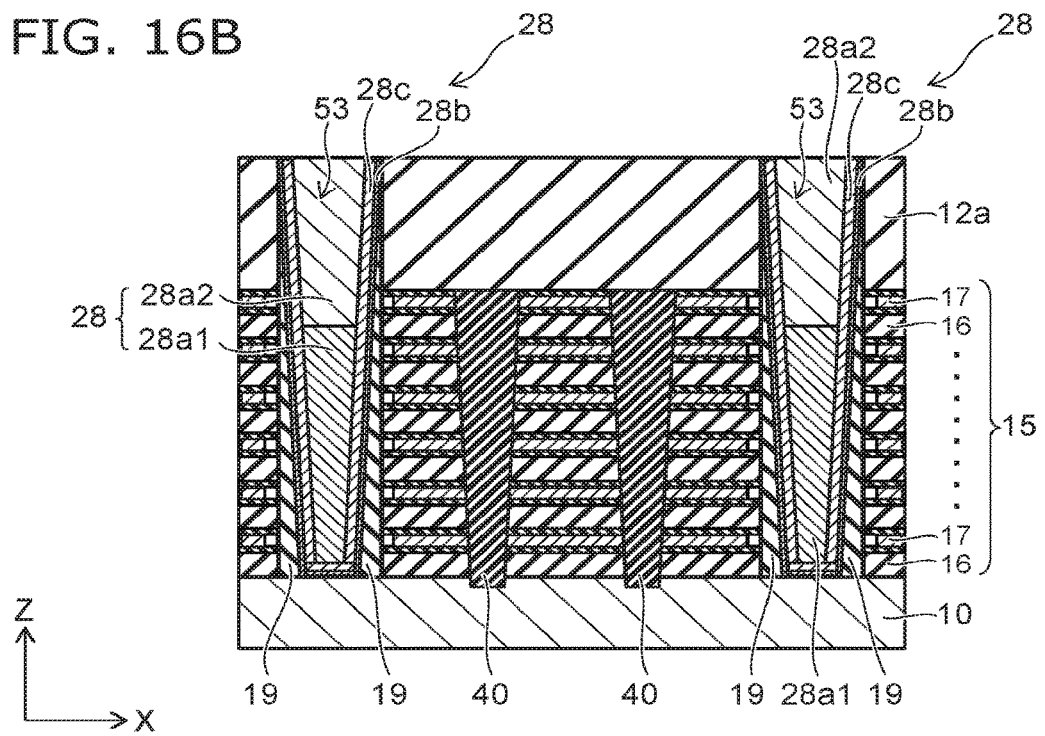

Next, as shown in FIG. 16A and FIG. 16B, a conductive film is formed by depositing tungsten or molybdenum to be thick. Due to this, the upper portion 28a2 is formed in the slit 53. The main body portion 28a including the lower portion 28a1 and the upper portion 28a2 is formed in the slit 53. The source electrode 28 is formed so as to include the main body portion 28a, the peripheral portion 28b, and the conductive portion 28c. The source electrode 28 is formed such that the peripheral portion 28b covers a surface of the conductive portion 28c and the conductive portion 28c covers a surface of the main body portion 28a.

Thereafter, the plug 30 and bit lines 31 are formed in the memory cell region Rm, and, the contacts 32 and upper-layer word lines 33 are formed in the contact region Rc. Subsequently, a plurality of semiconductor memory devices 1 are divided by dicing the wafer.

In this manner, the semiconductor memory device 1 according to the embodiment is manufactured.

Hereinafter, advantages of the embodiment will be described.

As the embodiment, the lower portion 28a1 of the source electrode 28 is formed of a material having the compressive stress. When the source electrode 28 is provided in this manner, it is possible to relax the tensile stress which occurs in the Y-direction of the electrode film 17. Thereby, it is possible to reduce the difference of the warp of the substrate 10 between the X-direction and the Y-direction. Due to this, it is possible to suppress the warp of the substrate 10 and suppress the warp and crack of the wafer.

Moreover, as the embodiment, when the conductive portion 28c is provided between the main body portion 28a and the peripheral portion 28b, it is possible to reduce a resistance value of the source electrode 28. Thereby, it makes a current easy to flow in the source electrode 28. Due to this, it is possible to suppress the failure of the memory operation caused by a current hardly flowing in the source electrode 28.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
a substrate;
a stacked body provided on the substrate and including a plurality of electrode films stacked separately from each other;
a pillar structure provided in the stacked body and including a semiconductor layer extending in a stacking direction of the stacked body;
at least one charge storage film provided between the semiconductor layer and the electrode films; and
a plurality of first electrodes extending along the stacking direction from an upper end to a lower end of the stacked body that includes the electrode films, each of the first electrodes extending in a first direction along a surface of the substrate and contacting the substrate,
the first electrodes being disposed in a second direction along the surface of the substrate, the second direction crossing the first direction, and
the first electrodes including first and second portions, the first portion containing a material having conductivity, the second portion containing a material whose linear expansion coefficient is lower than a linear expansion coefficient of silicon, the second portion being positioned between the first portion and the substrate in the stacking direction.

2. The device according to claim 1, wherein the second portion has a compressive stress.

3. The device according to claim 1, wherein the second portion contains silicon oxide.

4. The device according to claim 1, wherein the second portion contains at least any of titanium nitride, titanium silicide, and titanium aluminum nitride.

5. The device according to claim 1, wherein the second portion contains silicon nitride.

6. The device according to claim 1, wherein the first portion has a tensile stress.

7. The device according to claim 1, wherein the first portion contains tungsten or molybdenum, and the first electrodes include a conductive first layer covering the first and second portions.

8. The device according to claim 1, wherein the first electrodes include a conductive portion covering at least the second portion.

9. The device according to claim 8, wherein the conductive portion is provided between the stacked body and the second portion.

10. The device according to claim 8, wherein the conductive portion is formed of a same material as the first portion.

11. The device according to claim 8, wherein the first portion contains tungsten or molybdenum, and the first electrodes further include a conductive first layer provided between the stacked body and the conductive portion and covering the first and second portions.

12. A semiconductor memory device comprising:
a substrate;
a stacked body provided on the substrate and including a plurality of electrode films stacked separately from each other;
a pillar structure provided in the stacked body and including a semiconductor layer extending in a stacking direction of the stacked body;
at least one charge storage film provided between the semiconductor layer and the electrode films; and
a plurality of first electrodes extending along the stacking direction from an upper end to a lower end of the stacked body that includes the electrode films, each of the first electrodes extending in a first direction along a surface of the substrate and contacting the substrate,
the first electrodes being disposed in a second direction along the surface of the substrate, the second direction crossing the first direction, and
the first electrode comprising:
a main body portion including first and second portions, the second portion being positioned between the first portion and the substrate in the stacking direction;
a peripheral portion provided between the stacked body and the main body portion; and
a conductive portion provided between the peripheral portion and the second portion,
the first portion containing a material having conductivity, and
the second portion containing a material that a linear expansion coefficient is lower than a linear expansion coefficient of silicon.

13. The device according to claim 12, wherein the second portion has a compressive stress.

14. The device according to claim 12, wherein the second portion contains silicon oxide.

15. The device according to claim 12, wherein the second portion contains at least any of titanium nitride, titanium silicide, and titanium aluminum nitride.

16. The device according to claim 12, wherein the conductive portion is formed of a same material as the first portion.

17. The device according to claim 12, wherein the first portion contains tungsten or molybdenum, and the peripheral portion includes titanium nitride.

18. A semiconductor memory device comprising:
a substrate;
a stacked body provided on the substrate and including a plurality of electrode films stacked separately from each other;
a pillar structure provided in the stacked body and including a semiconductor layer extending in a stacking direction of the stacked body;
at least one charge storage film provided between the semiconductor layer and the electrode films; and
a plurality of first electrodes extending along the stacking direction from an upper end to a lower end of the stacked body that includes the electrode films, each of the first electrodes extending in a first direction along a surface of the substrate and contacting the substrate,
the first electrodes being disposed in a second direction along the surface of the substrate, the second direction crossing the first direction, and
the first electrodes including first and second portions, the first portion containing a material having conductivity, the second portion containing a material having a compressive stress, the second portion being positioned between the first portion and the substrate in the stacking direction.

* * * * *